United States Patent [19]
Yarbrough et al.

[11] Patent Number: 5,408,147
[45] Date of Patent: Apr. 18, 1995

[54] VCC TRANSLATOR CIRCUIT

[75] Inventors: Roy L. Yarbrough, Hiram; Jay R. Chapin, S. Portland, both of Me.

[73] Assignee: National Semiconductor Corporation, Santa Clara, Calif.

[21] Appl. No.: 116,920

[22] Filed: Sep. 7, 1993

[51] Int. Cl.[6] .......................................... H03K 19/094
[52] U.S. Cl. ....................................... 326/68; 326/121
[58] Field of Search ................. 307/443, 451, 475, 264

[56] References Cited

U.S. PATENT DOCUMENTS

| | | | |
|---|---|---|---|
| 5,101,125 | 3/1992 | Hara et al. | 307/475 |
| 5,115,434 | 5/1992 | Aizaki | 307/451 X |
| 5,136,190 | 8/1992 | Chern et al. | 307/475 |
| 5,300,832 | 4/1994 | Rogers | 307/475 |
| 5,317,214 | 5/1994 | Lewis | 307/443 X |
| 5,321,324 | 6/1994 | Hardee et al. | 307/475 |

*Primary Examiner*—David R. Hudspeth
*Attorney, Agent, or Firm*—Chris A. Caseiro; Thomas L. Bohan

[57] ABSTRACT

A circuit for translating logic signals from circuits supplied by one high-potential power rail to circuits supplied by another high-potential power rail in which the potentials of the two high-potential rails are not equal. The translator of the present invention is utilized in the transition from a 3V-supplied circuit to a 5V-supplied circuit, or vice versa, without any static current $I_{CCt}$ and regardless of the power-up sequencing. The static current is eliminated by isolating the output of the first stage of the translator, which is at the first high-potential power rail level, from all transistors of the second stage that are tied directly to the second high-potential power rail. In the preferred embodiment of the invention the transistors of the second stage that are powered by the second high-potential power rail are PMOS transistors and the isolation is achieved by linking those PMOS transistors to the first stage through a series of controlling NMOS transistors. In that way, the PMOS transistors will be completely turned off when necessary so as to avoid any undesirable conduction paths occurring due to differences in the potentials of the two high-potential power rails.

14 Claims, 2 Drawing Sheets

VCC TRANSLATOR CIRCUIT

BACKGROUND OF THE INVENTION

1. Field of the Invention

The present invention relates to a circuit that provides a transition between sub-circuit components operating at different high-potential levels. In particular, the present invention relates to a dual-potential-interface-buffer circuit that operates independent of the sequencing of the respective high-potential power rails without significant power losses in the system. More particularly, the present invention is directed to an interface buffer circuit that provides an interface between subcircuits supplied by a 3 V high-potential rail and subcircuits supplied by a 5 V high-potential rail while preventing any direct static current leakage path from either high-potential rail to the other or to ground.

2. Description of the Prior Art

It is well known that continuing goals in the electronics industry are to: 1) increase the speed of; 2) reduce the size of; and 3) reduce the power required for electronic systems including, but not limited to, computer systems. Applications directly related to achieving these goals include laptop computers, handheld computers, and the like. It is well known that in order to accomplish these goals the size of primary components—mainly MOS and bipolar transistors and related elements—must be reduced. This reduction in component size has been achieved—and continues to be improved—through improved fabrication techniques. The smaller semiconductor devices created are faster and require less power to operate than their predecessors. As a result of these efforts, recent industry guidelines have been implemented for standardization of the power supply utilized to operate these components. In particular, the Joint Electron Device Engineering Council (JEDEC) of the Electronic Industries Association has adopted a standard for new "low" high-potential power rails— JEDEC Standard 8-1A. Standard 8-1A provides for the implementation of high-potential rails at a nominal value of 3.3 V—generally referred to as a 3 V supply.

The use of a 3 V power supply is advantageous in that there is less power dissipation and so the operating life of the system is extended-in comparison to circuitry powered by a standard 5 V supply. It is also useful to incorporate MOS transistors that can operate on the 3 V power supply because their logic-high potential levels are then comparable to the logic-high potential levels for bipolar transistors.

While utilization of semiconductor devices that only require the 3 V supply to operate is a primary goal, many systems and subsystems in use today are fabricated of "large" components that must be powered by the more conventional 5 V supply. As a result, subcircuits having the new smaller devices are often coupled to circuitry that operates on a 5 V supply. One particular example of a joining of subcircuits using unequal power supplies is the personal digital assistant—a term commonly used to describe very small personal computers such as handheld computers. These systems incorporate microprocessors, peripheral ports, and the like that operate on a 3 V supply. However, most disk controllers to which these subsystems are coupled operate on a 5 V supply. Because of the obvious need to transfer data between these subsystems, power supply "translators" are necessary to provide for appropriate transitions between the subcircuits operating on incompatible power supplies.

Of key importance in the design of these 3 V,5 V translators is the ability to prevent unwanted conduction through the circuit—a problem of particular concern in the field of translators, given the fact that coupled subsystems are operating with unequal high-potential levels and logic-high levels. In most cases, CMOS devices operating at full 5 V rail-to-rail logic levels have no direct current path between the high-potential rail, generally designated as $V_{CC}$, and the low-potential rail GND and so there is no unwanted conduction path between the two rails. However, when circuit devices operate at logic levels generally associated with bipolar transistors—that is, with logic-high levels on the order of 3.5 V on a 5 V high-potential power rail—such conduction paths can exist. Of course, similar logic-high levels are anticipated, as noted, in MOS devices operating on a 3 V power supply. As a result, when MOS transistors operating on unequal power supplies are coupled, the same unwanted conduction paths observed in BiCMOS circuits arise.

Static current, or leakage current, or static high current, designated generally as $I_{CCt}$, are terms used to define the condition when there is a continuous conduction path from or to $V_{CC}$ when none should exist. This static current acts to dissipate power in a subsystem where power usage is not desired. While $I_{CCt}$ is often quite small on an isolated basis, in a system having many subcircuits manifesting this leakage current, the power dissipation multiplies to the point where it can significantly reduce the power available for desired operations. This is particularly critical where the initial power supply voltage is reduced, such as is the case with 3 V high-potential rails. Therefore, 3 V,5 V translator designs must be focused on the importance of minimizing, if not eliminating, unwanted static current.

Examples of translators presently available are illustrated in FIGS. 1 and 2. The translator illustrated in FIG. 1 includes an input inverter stage PA1,NA1 coupled to a first high-potential rail $V_{CCA}$ and pullup/pulldown output stage PB1, NB1 coupled to a second high-potential rail $V_{CCB}$, where the potentials of $V_{CCA}$ and $V_{CCB}$ are not equal. Optionally, an NMOS swing transistor NA3, with its drain tied to its control node so that it is always on, can be coupled between $V_{CCA}$ and PMOS transistor PA1 so as to reduce the voltage at the source of PA1. In this way, $V_{IN}$ can turn PA1 on or off faster. The circuit illustrated in FIG. 1 provides translation without static current $I_{CCt}$ when $V_{IN}$ is logic-high, whether that logic-high is at a potential of 5 V or 3 V. This circuit also provides translation without static current $I_{CCt}$ when $V_{IN}$ is logic-low, but only when $V_{CCA} > V_{CCB}$. When $V_{CCB} > V_{CCA}$ and $V_{IN}$ is logic-low, $I_{CCt}$ does not equal zero because the potential at the gate of pullup PMOS transistor PB1 is insufficient to turn that transistor off. Therefore, the FIG. 1 translator fails to prevent static current in all cases.

The translator illustrated in FIG. 2 includes the input inverter stage PA1, NA1, and a pullup/pulldown stage PB2,NB2, similar to that of the FIG. 1 translator, as part of an output stage coupled primarily to high-potential rail $V_{CCB}$. It is necessary to include a blocking diode D1 in the FIG. 2 translator in order to block conduction from $V_{CCB}$ through PMOS transistor PB1 to $V_{CCA}$ when $V_{CCB} > V_{CCA}$ and $V_{IN}$ is logic-high. Additionally, latch transistors PB1 and NB1 pull node A either all the way up to the potential of high-potential rail $V_{CCB}$ or all the way down to the potential of low-potential rail GND so that the gates of pullup and pulldown transistors PB2 and NB2 are at one or the other of those levels. In that way, PMOS transistor PB2 and NMOS transistor NB2 are either completely on or completely off. Optionally, a swing transistor such as the NMOS swing transistor NA3 illustrated in FIG. 1, can be coupled between $V_{CCB}$ and PMOS latch transistor PB1 so as to perform the same function indicated for transistor NA3 of FIG. 1. The circuit illustrated in FIG. 2 provides translation without static current $I_{CCt}$ when $V_{IN}$ is logic-high, whether that logic-high is at a potential of 5 V or 3 V. The FIG. 2 circuit also provides translation without static current $I_{CCt}$ when $V_{IN}$ is logic-low, but only when $V_{CCB} > V_{CCA}$. However, when $V_{CCA} > V_{CCB}$ and $V_{IN}$ is logic-low, $I_{CCt}$ does not equal zero because the potential at the gate of latch transistor PB1 is insufficient to turn that transistor off and a conduction path therefore exists from $V_{CCA}$ through blocking diode D1, transistors PA1 and PB1, to $V_{CCB}$. Therefore, the translator is inadequate for all translation situations.

What is needed is a translation circuit that provides for transition from a subcircuit operating on a power supply at one potential to a subcircuit operating on a power supply at a different potential, and vice-versa. Further, what is needed is a translation circuit for translating a subcircuit operating on a 3 V supply to one operating on a 5 V supply, and vice-versa. Still further, what is needed is a 3 V,5 V translator that operates in all translation situations while maintaining $I_{CCt}$ essentially at zero.

SUMMARY OF THE INVENTION

It is an object of the present invention to provide a translator circuit for making the transition from a subsystem powered by a supply at one potential to a subsystem powered by a supply at a different potential, and vice-versa. As a subset of that objective, it is also an object of the present invention to provide a translator circuit for making the transition from a subsystem powered by a 3 V power supply to a subsystem powered by a 5 V power supply, and the transition from a 5 V subsystem to a 3 V subsystem, regardless of the sequencing of the transition. It is a further object of the present invention to provide a 3 V,5 V translator that can be used to provide the transitions noted without any static leakage current $I_{CCt}$.

The noted objectives are achieved in the present invention by isolating completely the two unequal high-potential rails, designated generally as $V_{CCA}$ and $V_{CCB}$, wherein $V_{CCA}$ is coupled to the input stage of the translator and $V_{CCB}$ is coupled to the output stage of the translator. This isolation is accomplished by eliminating any direct pathway between the two high-potential rails. Unlike the prior translators illustrated in FIGS. 1 and 2, the present invention involves coupling the source nodes and the control nodes of the PMOS transistors of the output stage of the translator to the same high-potential rail. In the earlier translators, one or more of the output stage PMOS transistors has either its source node or its control node tied to one of the two high-potential rails while the other of those two nodes is tied to the other high-potential rail. As a result, there will exist the situation wherein the gate-to-source potential difference is sufficient to keep that particular PMOS transistor on when it should be off. Of course, that is when a leakage current $I_{CCt}$ exists.

In order to achieve the complete power supply isolation for the input and output stages of the translator, the circuit of the present invention has a standard input stage coupled to the first high-potential rail $V_{CCA}$ and an output stage coupled to the second high-potential rail $V_{CCB}$. The output stage includes a pullup/pulldown stage formed of a complementary transistor pair. In the preferred embodiment of the invention, the output stage also includes a first control stage and a second control stage wherein the first and second control stages operate in complementary fashion to control the pullup/pulldown stage and to turn completely on and completely off all PMOS transistors of the output stage.

The first control stage includes a first PMOS control transistor and a first NMOS control transistor, wherein the control node of the first NMOS transistor is coupled to the data input signal $V_{IN}$, its source is coupled to GND, and its drain is coupled to a node tied to the control node of the first PMOS control transistor. The source of the first PMOS control transistor is coupled directly to $V_{CCB}$ and its drain is tied to a node linked to the control node of the pullup transistor. The second control stage includes a second PMOS control transistor and a second NMOS control transistor, wherein the control node of the second NMOS transistor is coupled to the data signal transmitted by the input stage, its source is coupled to GND, and its drain is coupled to a node tied to the control nodes of the pullup transistor and the second PMOS control transistor. The source of the second PMOS control transistor is coupled directly to $V_{CCB}$ and its drain is tied to the node linking the drain of the first NMOS control transistor to the control node of the first PMOS control transistor.

It is to be noted that bipolar transistors and BiCMOS circuits in particular may form parts of the subsystems involved in the translator of the present invention, provided that isolation of the different high-potential rails is maintained as indicated. In any event, through the translator circuit design generally described above, the transition from a subcircuit supplied by one high-potential power rail to another subcircuit with a different high-potential power rail can be achieved regardless of the power-up sequence and the initial input signal, and without any static current. These novel features and others will become apparent upon review of the detailed description of the preferred embodiment and the appended claims.

DETAILED DESCRIPTION OF THE PREFERRED EMBODIMENT OF THE PRESENT INVENTION

Figure 1:
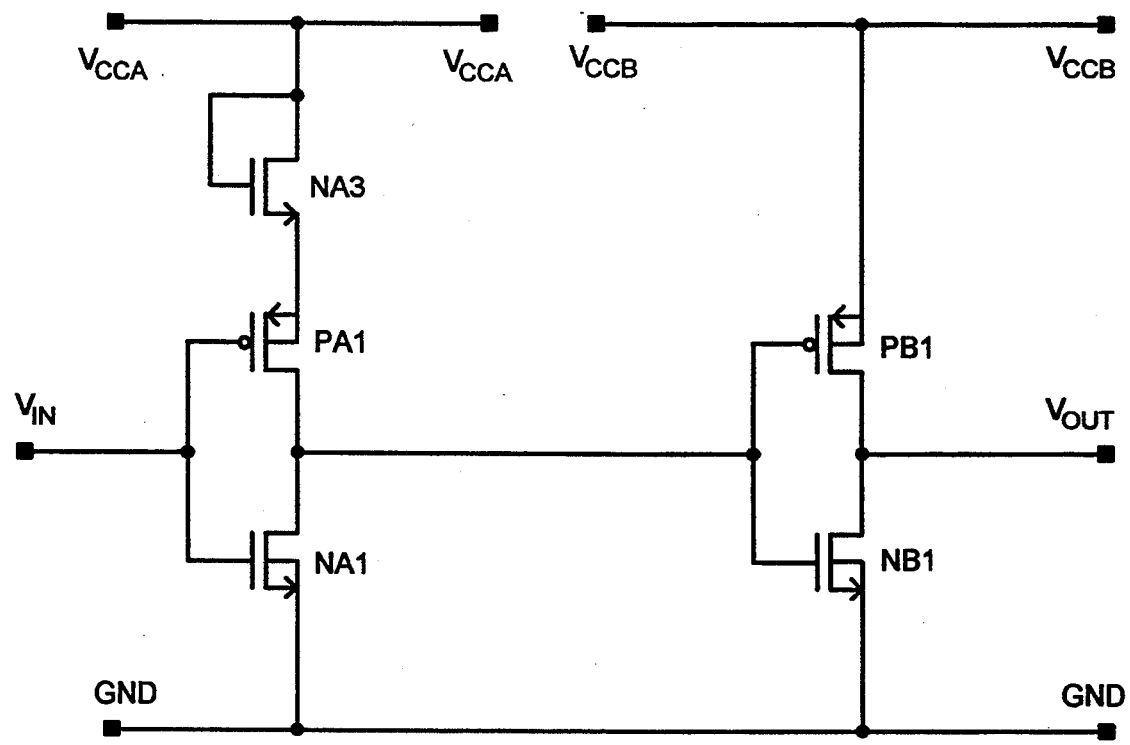
FIG. 1 is a schematic diagram of a first 3 V,5 V translator of the prior art.
Figure 2:
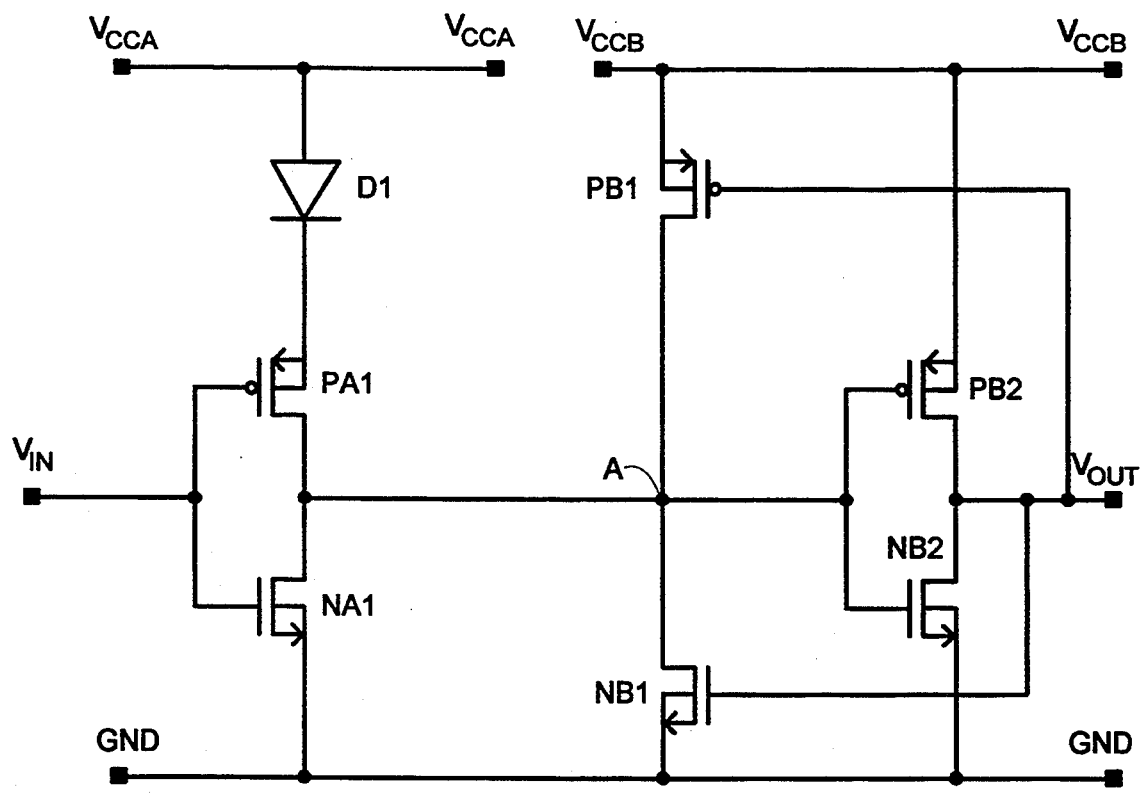
FIG. 2 is a schematic diagram of a second 3 V,5 V translator of the prior art.
Figure 3:
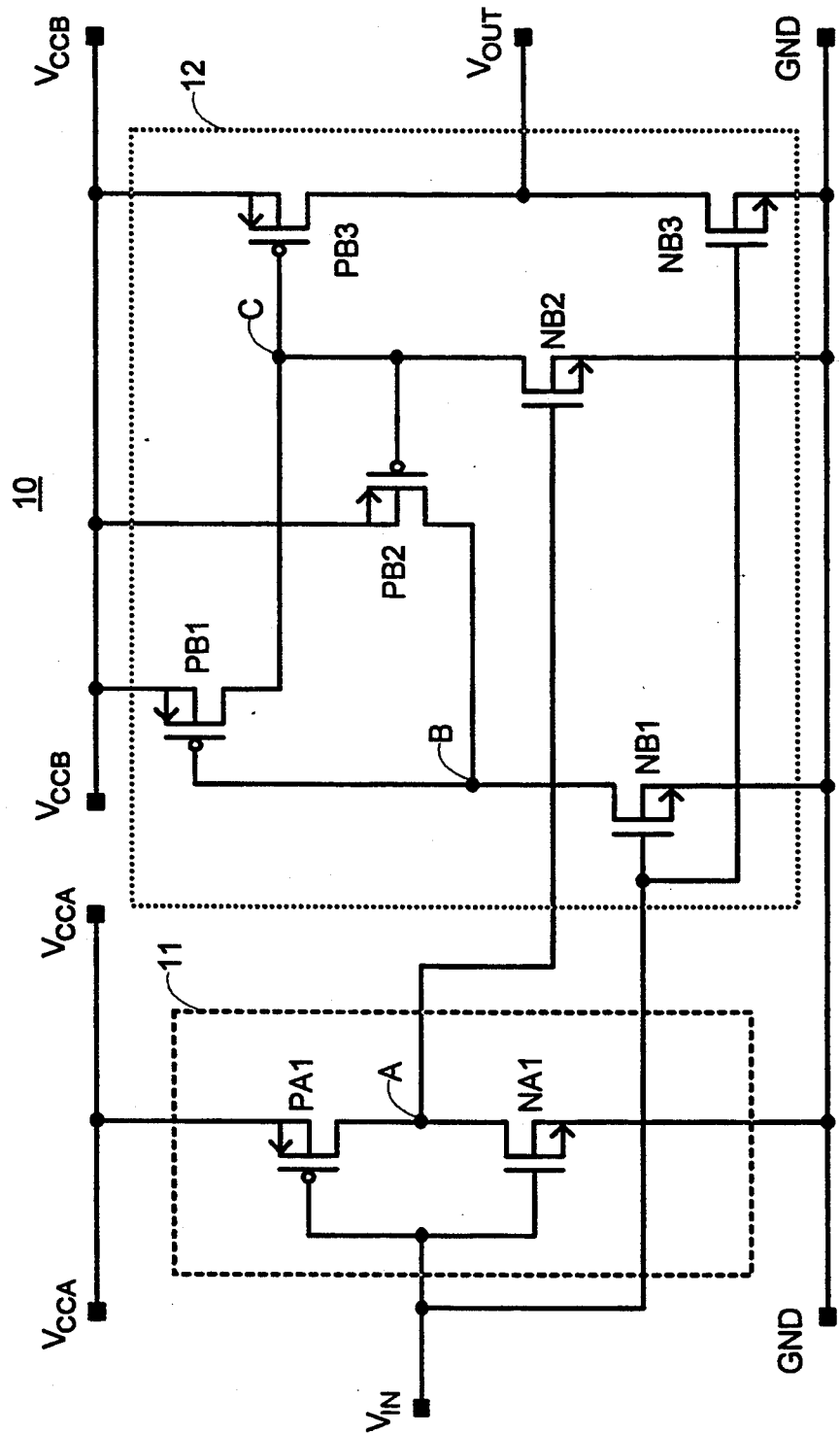
FIG. 3 is a schematic diagram of the 3 V,5 V translator of the present invention.

The device of the present invention is an interface translator circuit 10 having an input stage 11 isolated from an output stage 12, as illustrated in FIG. 3. The input stage 11 and the output stage 12 are coupled to first high-potential rail $V_{CCA}$ and second high-potential rail $V_{CCB}$, respectively. The interface translator circuit 10 operates as required regardless of the voltage levels of $V_{CCA}$ and $V_{CCB}$; that is, $V_{CCA}$ may be at a nominal 3 V level and $V_{CCB}$ at a nominal 5 V level, for example, or vice-versa, and the necessary transition will be accomplished without any static current $I_{CCt}$.

With continuing reference to FIG. 3, the input stage 11 of the translator circuit 10 of the present invention includes a standard inverting CMOS transistor pair, PA1,NA1, wherein a logic input $V_{IN}$ is coupled to the gates of PMOS input transistor PA1 and NMOS input transistor NA1. The source and the bulk of transistor PA1 are coupled directly to first high-potential rail $V_{CCA}$, and its drain is coupled to the drain of transistor NA1 at node A, which is the output node of input stage 11. The source and bulk of transistor NA1 are coupled directly to low-potential rail GND. Although the input stage 11 of the preferred embodiment of the present invention includes a single inverting transistor pair, it is to be understood that the input stage 11 may include a variety of integrated circuit devices. The key to the invention lies in achieving the transition from the input stage 11 to the output stage 12 when those two stages are powered by unequal high-potential power rails.

In the preferred embodiment of the present invention the output stage 12 includes three PMOS transistors and three NMOS transistors. The source and the bulk of first PMOS output transistor PB1 are coupled directly to second high-potential rail $V_{CCB}$, its gate is coupled to the drain of first NMOS output transistor NB1 and to the drain of second PMOS transistor PB2 at node B, and its drain is coupled to the drain of second NMOS output transistor at node C. The source and bulk of transistor NB2 are coupled to GND, and its gate is coupled to the output of the input stage 11 at node A. The source and bulk of transistor PB2 are coupled directly to $V_{CCB}$, its drain is coupled to the gate of PB1 and to the drain of NB1 at node B, as noted. As a result, the gate of transistor PB1 is not coupled directly to the input stage 11 of the translator circuit 10 but is instead isolated by NB1. The gate of PB2 is coupled to the drain of PB1 and to the drain of NB2 at node C.

A key feature of the present invention is the link between the input stage 11 and the output stage 12 at node A. Specifically, as can be seen from FIG. 3, node A is coupled directly to the gate of second NMOS output transistor NB2. In this arrangement transistor NB2 isolates the gates of output PMOS transistors PB2 and PB3 from the input stage 11 of the translator circuit 10. As a result, and along with the operation of transistor NB1, the gates and the sources of all PMOS transistors of the output stage 12 are isolated from $V_{CCA}$. The source and bulk of transistor NB2 are coupled directly to GND.

Third PMOS output transistor PB3 and third NMOS output transistor NB3 are the pullup and pulldown transistors, respectively, of the output stage 12, with the drains of those two transistors coupled together at translator output $V_{OUT}$. As with the other output transistors, the source and bulk of PB3 are coupled directly to $V_{CCB}$, and the source and bulk of NB3 are coupled directly to GND. The gate of PB3 is coupled to the drains of transistors PB1 and NB2 at node C. The gate of NB3 is coupled directly to $V_{IN}$.

In operation, the interface translator circuit 10 illustrated in FIG. 3 is an inverter, switching a first logic level at input $V_{IN}$ to a second logic level at output $V_{OUT}$. When $V_{IN}$ is at logic-high (H), that is, at about the potential of first high-potential rail $V_{CCA}$, PMOS input transistor PA1 is off, NMOS input transistor NA1 is on, and node A is at logic-low (L), corresponding to low-potential rail GND. In addition, first NMOS output transistor NB1 and third NMOS output transistor NB3 are also on. With first NMOS output transistor NB1 on, node B of the output stage 12 is at logic L. By the same operation, output $V_{OUT}$ is also at logic L. Also, with first NMOS output transistor NB1 on, first PMOS output transistor PB1 is on, thereby putting node C at logic H, corresponding to the potential of second high-potential rail $V_{CCB}$. As a result, third PMOS output transistor PB3 is off. Finally, since node A is at logic L, second NMOS output transistor NB2 is off and so second PMOS output transistor PB2 is also off. Consequently, $V_{OUT}$ will be logic L; in particular, it will be at the potential of the common low-potential rail GND.

When $V_{IN}$ is at logic L, corresponding to low-potential rail GND, PA1 is on and node A is at logic H, corresponding to $V_{CCA}$. In addition, transistors NB1 and NB3 are off. When node A is at logic H, transistor NB2 is on, and so transistor PB2 is on as well. With transistor PB2 on and transistor NB1 off, transistor PB1 is completely off. At the same time, transistor PB3 is held on by transistor NB2, thereby maintaining output $V_{OUT}$ at logic H, corresponding to $V_{CCB}$.

In the transition of $V_{IN}$ from one logic level to another; that is, from H→L or L→H, the interface translator circuit 10 of the present invention operates as required, again regardless of the voltage levels of $V_{CCA}$ and $V_{CCB}$. Specifically, when $V_{IN}$ switches from H→L, transistors NA1, NB1 and NB3 are switched off and transistor PA1 is switched on. Node A is pulled up to logic H, corresponding to $V_{CCA}$, thereby turning transistor NB2 on. NB2 in turn switches transistors PB2 and PB3 on and PB2 then shuts transistor PB1 off completely. With transistor PB3 on and transistor NB3 off, output $V_{OUT}$ is pulled up to logic H, corresponding to $V_{CCB}$. In the logic-level transition of input $V_{IN}$ from L→H, transistors NA1, NB1 and NB3 are switched on, and transistor PA1 is switched off. Node A is therefore pulled down to logic level L, corresponding to GND. With node A at L, transistor NB2 is switched off, thereby switching transistor PB2 off. As a result, with NB1 on and PB2 off, transistor PB1 is switched on, transistor PB3 is switched off, and output node $V_{OUT}$ is thus pulled down to logic L, corresponding to potential rail GND.

Although the preferred embodiment of the present invention has been described herein, the above description is merely illustrative. Further modification of the invention herein disclosed will occur to those skilled in the respective arts and all such modifications are deemed to be within the scope of the invention as defined by the appended claims.

What is claimed is:

1. A translator circuit for translating a logic signal from a first circuit to a second circuit, said translator circuit comprising:

(a) an input stage complable to an output of said first circuit, wherein said input stage is powered by a first high-potential power rail; and (b) an output stage couplable to an input of said second circuit, wherein said output stage is powered by a second high-potential power rail not equal in potential to said first high-potential power rail, said output stage having one or more output transistors, each of said one or more output transistors having a high-potential node and a control node, with said high-potential node and said control node of each of said one or more output transistors isolated from said first high-potential power rail.

2. The translator circuit as claimed in claim 1, said output stage comprising a first output transistor and a third output transistor, each having control nodes couplable to said output of said first circuit, and a second output transistor having a control node couplable to an output of said input stage.

3. The translator circuit as claimed in claim 2 further comprising a fourth output transistor, a fifth output transistor, and a sixth output transistor, wherein said fourth, fifth, and sixth transistors are coupled to said second high-potential power rail.

4. The translator circuit as claimed in claim 3 wherein said first, second, and third output transistors are NMOS transistors and said fourth, fifth, and sixth output transistors are PMOS transistors.

5. The translator circuit as claimed in claim 4 wherein a drain of said first output transistor is coupled to a control node of said fourth output transistor and to a drain of said fifth output transistor and a drain of said second output transistor is coupled to the control nodes of said fifth and sixth output transistors and to a drain of said fourth output transistor.

6. A translator circuit comprising:
(a) an input stage having means for receiving an input signal, wherein said input stage is coupled to a first high-potential power rail; and
(b) an output stage having output means for transmitting an output signal, wherein said output stage is coupled to a second high-potential power rail not equal in potential to said first high-potential power rail, said output stage comprising:
(i) a first output transistor and a third output transistor, each having control nodes coupled to said input signal, and a second output transistor coupled to an output node of said input stage; and
(ii) a fourth output transistor, a fifth output transistor, and a sixth output transistor coupled to said second high-potential power rail.

7. The translator circuit as claimed in claim 6 wherein said input stage is an inverter stage comprising a first input transistor and a second input transistor.

8. The translator circuit as claimed in claim 7 wherein said first input transistor is a PMOS transistor having a gate coupled to said input signal, a source coupled to said first high-potential power rail, and a drain coupled to said output node of said input stage and to a drain of said second input transistor, wherein said second input transistor is an NMOS transistor having a gate coupled to said input signal, a source coupled to a low-potential power rail, and a drain coupled to said output node of said input stage.

9. The translator circuit as claimed in claim 8 wherein said first output transistor, said second output transistor, and said third output transistor are NMOS transistors.

10. The translator circuit as claimed in claim 9 wherein said fourth output transistor, said fifth output transistor, and said sixth output transistor are PMOS transistors, said fourth output transistor having a gate coupled to the drain of said first output transistor, a source coupled to said second high-potential power rail, and a drain coupled to the drain of said second output transistor, said fifth output transistor having a gate coupled to the drains of said fourth output transistor and said second output transistor, a source coupled to said second high-potential power rail, and a drain coupled to the drain of said first output, and said sixth output transistor having a gate coupled to the drains of said fourth output transistor and said second output transistor, a source coupled to said second high-potential power rail, and a drain coupled to said means for transmitting an output signal.

11. A translator circuit for translating a logic signal from a first circuit to a second circuit, said translator circuit having an input stage coupled to an output of said first circuit and powered by a first high-potential power rail, and an output stage having an input coupled to an output of said input stage, an output coupled to said second circuit, and powered by a second high-potential power rail, wherein the potential of said first high-potential rail is not equal to the potential of said second high-potential rail, said output stage comprising:
(a) a first NMOS transistor having a gate coupled to said output of said first circuit and a source coupled to a low-potential power rail;
(b) a second NMOS transistor having a gate coupled to said output of said input stage and a source coupled to said low-potential power rail;
(c) a third NMOS transistor having a gate coupled to said output of said first circuit and a source coupled to said low-potential power rail;
(d) a first PMOS transistor having a gate coupled to the drain of said first NMOS transistor, a source coupled to said second high-potential power rail, and a drain coupled to the drain of said second NMOS transistor;
(e) a second PMOS transistor having a gate coupled to the drains of said first PMOS transistor and said second NMOS transistor, a source coupled to said second high-potential power rail, and a drain coupled to the drain of said first NMOS transistor; and
(f) a third PMOS transistor having a gate coupled to the drains of said first PMOS transistor and said second NMOS transistor, a source coupled to said second high-potential power rail, and a drain coupled to the input of said second circuit.

12. A process for translating a logic signal from a first circuit powered by a first high-potential power rail to a second circuit powered by a second high-potential power rail not equal in potential to said first high-potential power rail, the process comprising the steps of:
(a) coupling an output of said first circuit to an input stage of a translator circuit, wherein said input stage is powered by said first high-potential power rail;
(b) coupling an output of said input stage to an output stage of said translator circuit, wherein said output stage is powered by said second high-potential power rail, said output stage comprising one or more PMOS output transistors;
(c) isolating control nodes and source nodes of said PMOS output transistors from said first high-potential power rail; and
(d) coupling an output of said output stage to said second circuit.

13. The translation process as claimed in claim 12 wherein said output stage includes a first NMOS transistor, a second NMOS transistor, a first PMOS transistor, a second PMOS transistor, and a third PMOS transistor.

14. The translation process as claimed in claim 13 wherein the step of isolating control nodes and source nodes of said PMOS output transistors further includes the steps of:
(a) coupling a gate of said first PMOS transistor to a drain of said first NMOS transistor, a source of said first PMOS transistor to said second high-potential power rail, and a drain of said first PMOS transistor to a drain of said second NMOS transistor;
(b) coupling a gate of said second PMOS transistor to the drains of said first PMOS transistor and said second NMOS transistor, a source of said second PMOS transistor to said second high-potential power rail, and a drain of said second PMOS transistor to the drain of said first NMOS transistor; and
(c) coupling a gate of said third PMOS transistor to the drains of said first PMOS transistor and said second NMOS transistor, a source of said third PMOS transistor to said second high-potential power rail, and a drain of said third PMOS transistor to an input of said second circuit.

* * * * *